United States Patent
Lou et al.

(10) Patent No.: US 11,057,987 B2
(45) Date of Patent: Jul. 6, 2021

(54) ASYMMETRIC DUAL BEND SKEW COMPENSATION FOR REDUCING DIFFERENTIAL MODE TO COMMON MODE CONVERSION

(71) Applicant: CISCO TECHNOLOGY, INC., San Jose, CA (US)

(72) Inventors: Jianquan Lou, Shanghai (CN); Alpesh U. Bhobe, Sunnyvale, CA (US); Juhi Garg, Bangalore (IN); Joel Richard Goergen, Soulsbyville, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/276,073

(22) Filed: Feb. 14, 2019

(65) Prior Publication Data

US 2020/0267833 A1  Aug. 20, 2020

(51) Int. Cl.
*H05K 1/02* (2006.01)
*H01P 3/08* (2006.01)
*H01P 1/02* (2006.01)

(52) U.S. Cl.
CPC .............. *H05K 1/0248* (2013.01); *H01P 1/02* (2013.01); *H01P 3/08* (2013.01); *H05K 1/0243* (2013.01); *H05K 1/0245* (2013.01); *H05K 2201/09218* (2013.01)

(58) Field of Classification Search
CPC ....... H05K 1/0245; H05K 1/0248; H01P 1/02
USPC ........................................................ 333/4, 5
See application file for complete search history.

(56) References Cited

U.S. PATENT DOCUMENTS

| 8,835,775 | B2 | 9/2014 | Fan et al. | |
|---|---|---|---|---|
| 9,024,196 | B2 | 5/2015 | Yoneya et al. | |
| 2007/0063783 | A1* | 3/2007 | Kanno et al. | H01P 3/081 333/4 |
| 2013/0049878 | A1* | 2/2013 | Shiue et al. | H05K 1/0245 333/4 |
| 2015/0214596 | A1* | 7/2015 | Kawai | H05K 1/0248 333/4 |

OTHER PUBLICATIONS http://www.ieice.org, Y. Kayano et al., Weak-Coupled Cross-Sectional Differential-Paired Lines with Bend Discontinuities, 2014.

(Continued)

*Primary Examiner* — Benny T Lee
(74) *Attorney, Agent, or Firm* — Cindy Kaplan (57) ABSTRACT

In one embodiment, a method includes positioning a first component for generating a differential signal on a printed circuit board, positioning a second component for receiving the differential signal on a printed circuit board, and routing a differential conductor pair on a path between the first component and the second component, wherein the path comprises at least one turn in which the differential conductor pair changes direction. A first conductor and a second conductor of the differential conductor pair each comprise a plurality of sets of bends proximate to the turn to provide skew compensation while reducing differential mode to common mode conversion and wherein each of the sets of bends in the second conductor is aligned with one of the sets of bends in the first conductor.

18 Claims, 11 Drawing Sheets

(56) References Cited

OTHER PUBLICATIONS www.signalintegrityjournal.com, E. Kunz et al., Sources and Compensation of Skew in Single-Ended and Differential Interconnects, Apr. 2017.
www.researchgate.net, G. Shiue et al, Noise Reduction Using Compensation Capacitance for Bend Discontinuities, Aug. 2006.

* cited by examiner

ASYMMETRIC DUAL BEND SKEW COMPENSATION FOR REDUCING DIFFERENTIAL MODE TO COMMON MODE CONVERSION

TECHNICAL FIELD

The present disclosure relates generally to printed circuit boards (PCBs), and more particularly, to skew compensation for routed signals on a printed circuit boards in order to reduce generation of common mode signal thereby reducing electromagnetic interference from the PCB.

BACKGROUND

Signal lines (conductors, traces) are used to relay signals between devices on a printed circuit board, semiconductor chip package, or other electronic device. Differential signaling may be used to relay the signals by simultaneously transmitting two equal but opposite signal components among a differential conductor pair. If the two conductors in the differential conductor pair have a length difference, the simultaneously transmitted signals will arrive at a destination at different times. The difference in arrival times is referred to as skew. Conventional methods used to eliminate skew include introduction of bends into the shorter conductor.

BRIEF DESCRIPTION OF THE DRAWINGS

Corresponding reference characters indicate corresponding parts throughout the several views of the drawings.

DETAILED DESCRIPTION OF EXAMPLE EMBODIMENTS

Overview

In one embodiment, an apparatus generally comprises a printed circuit board and a differential conductor pair extending along a path between a first component configured to generate a differential signal and a second component configured to receive the differential signal. The path comprises at least one turn in which the differential conductor pair changes direction. A first conductor of the differential conductor pair comprises a first set of bends at a location proximate to the turn to provide skew compensation. The first set of bends comprises a first bend angled from a first straight portion extending along a longitudinal axis generally parallel to a second conductor of the differential conductor pair and a last bend angled towards a second straight portion extending along the longitudinal axis generally parallel to the second conductor. The second conductor comprises a second set of bends to reduce differential mode to common mode conversion. The second set of bends is asymmetric with the first set of bends and aligned therewith such that the second set of bends is longitudinally positioned between the first bend and the last bend of the first set of bends.

In one embodiment, the first set of bends, second set of bends, or both sets of bends comprise four bends. In one embodiment the second set of bends comprises eight bends.

In one embodiment, the first set of bends, the second set of bends or both sets of bends define a frustoconical shape.

In one embodiment, the second set of bends defines a first stepped section extending upward and a second stepped section extending downward such that a straight section interposed between the first and second stepped sections is located parallel to and above straight sections of the second conductor located before and after the second set of bends.

In one embodiment, the second set of bends comprises a matching pair of bends. In one embodiment, a straight section is interposed between the matching pair of bends and extends along a longitudinal axis of straight sections of the second conductor located before and after the second set of bends.

In another embodiment, a method generally comprises positioning a first component for generating a differential signal on a printed circuit board, positioning a second component for receiving the differential signal on a printed circuit board, and routing a differential conductor pair on a path between the first component and the second component, wherein the path comprises at least one turn in which the differential conductor pair changes direction. A first conductor and a second conductor of the differential conductor pair each comprises a plurality of sets of bends proximate to the turn to provide skew compensation while reducing differential mode to common mode conversion and wherein each of the sets of bends in the second conductor is aligned with one of the sets of bends in the first conductor.

In yet another embodiment, an apparatus generally comprises a printed circuit board and a differential conductor pair extending along a path between a first component configured to generate a differential signal and a second component configured to receive the differential signal The path comprises at least one turn in which the differential conductor pair changes directions. A first conductor of the differential conductor pair comprises a first set of bends at a location proximate to the turn to provide skew compensation and a second conductor comprises a second set of bends to reduce differential mode to common mode conversion. The second set of bends is asymmetric with the first set of bends and a number of bends in the second set of bends is greater than a number of bends in the first set of bends.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Differential pairs are often used in high speed digital circuits to introduce differential signaling to improve the data quality and reduce electromagnetic (EM) emissions from a Printed Circuit Board (PCB). However, benefits from using differential pairs diminish quickly if there is any imbalance in differential routing. Both physical and electrical features may contribute to imbalances but the most common is skew generated between positive P and negative N traces due to bends, Input/Output (I/O) connections in integrated circuits, or connectors. The generated skew may be a concern for both SI (Signal Integrity) and EMC (Electromagnetic Compatibility).

Turns in a differential pair path cause one conductor in the pair to have a length that is longer than the length of the other conductor in the pair. For example, as a pair of parallel conductors turn, one conductor will be on the inside of the turn while the other conductor is on the outside of the turn. At the end of the turn, the outside conductor will have a length, with respect to the starting point, that is longer than the inside conductor. This longer length results in a longer travel path for the signal component on the outside conductor relative to the signal component on the inside conductor and therefore results in a phase difference (skew) between the signals at the end of the turn. When phase skew occurs, the signal components operate substantially in common mode and the signals will emit significant EMI (Electromagnetic Interference) relative to the differential mode transmission that occurs when the signal components are in-phase and the signal quality may degrade.

In conventional systems, bends are introduced into one of the traces (signal lines, conductors) of the differential pair to eliminate the skew between positive (P) and negative (N) signals. However, these bends also introduce imbalance between the P and N traces. For example, corners of bends introduce extra parasitic parameters into one trace and lead to imbalance between the P and N traces. The impact of conventional skew compensation techniques on EMI makes it difficult to meet EMC standards. The extra imbalance deteriorates the differential mode to common mode conversion (Scd21) and the common mode noise generated due to the conversion may radiate out from cables, connectors, or leaks in a chassis, and cause EMI issues.

The embodiments described herein are directed to asymmetric dual bend configurations that not only compensate for skew between P and N traces in a differential conductor pair, but also reduce the imbalance between traces, thereby considerably reducing the differential mode (DM) to common mode (CM) conversion as compared to conventional skew compensation techniques.

Figure 1:
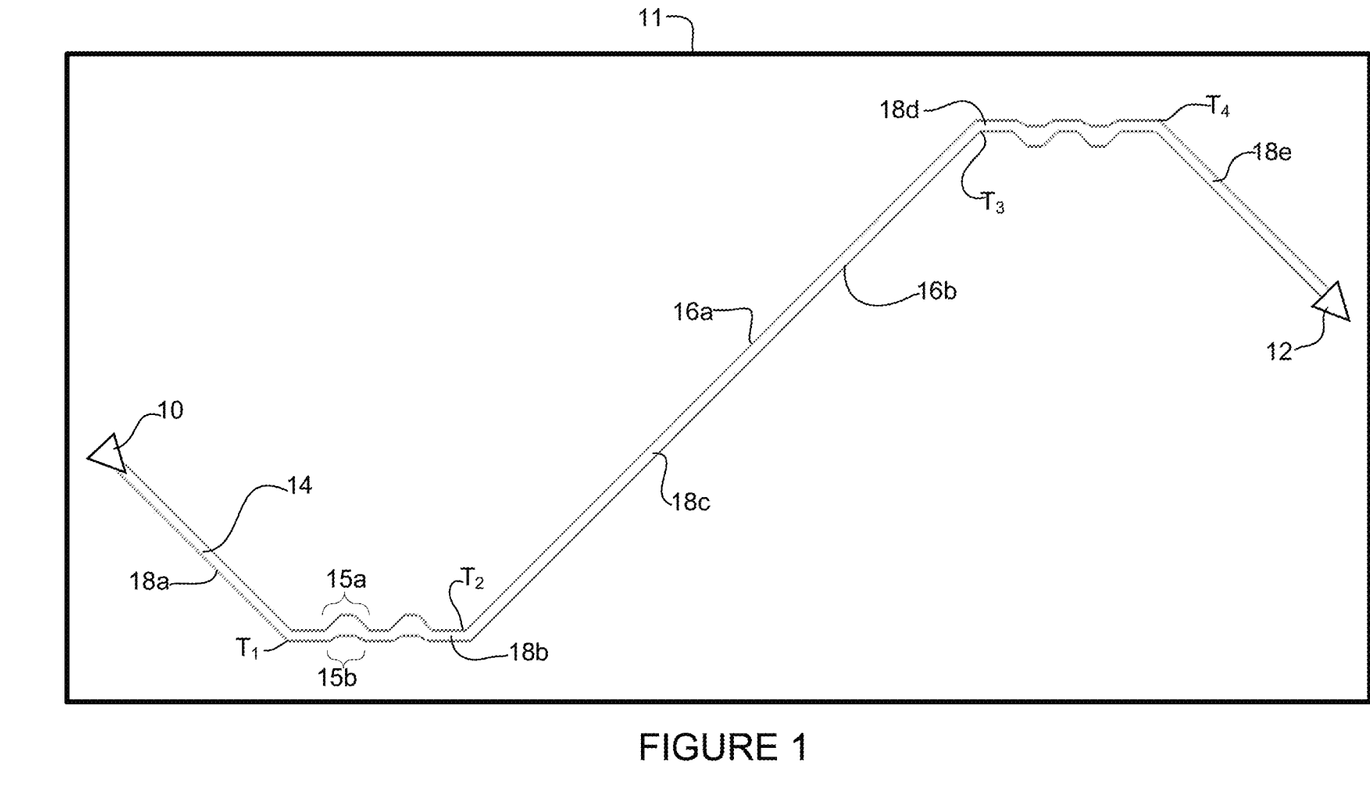
FIG. 1 is a schematic of a printed circuit board with electrical components connected by a differential conductor pair, in accordance with one embodiment.

Referring now to the drawings, and first to FIG. 1, a simplified schematic view of a printed circuit board (PCB) 11 is shown in accordance with one embodiment. First and second electrical components 10, 12 are connected by a differential conductor pair (differential pair) 14 comprising first (P) and second (N) parallel conductors (traces, signal lines) 16a, 16b. The first electronic component 10 may be any electrical component or element configured to generate a differential signal and the second electrical component 12 may be any electronic component or element configured to receive the differential signal.

The first electronic component 10 is configured to generate a differential signal for transmission to the second electrical component 12. A differential signal comprises first and second equal but opposite signal components that are simultaneously sent on the two separate conductors 16a, 16b of the differential conductor pair 14. These components of the differential signal comprise two 180 degrees out of phase signals that are simultaneously transmitted along the differential conductor pair 14.

As shown in the example of FIG. 1, the path followed by the differential conductor pair 14 comprises a plurality of turns in which the differential pair changes directions. In this example, there are four changes in direction (turns $T_1$, $T_2$, $T_3$, $T_4$), which may be needed to accommodate other components on the PCB 11, for example. The turns $T_1$, $T_2$, $T_3$, and $T_4$ define five sections 18a, 18b, 18c, 18d, and 18e in the path followed by the conductor pair 14. Phase skew is corrected through the use of skew compensation bends. The skew compensation bends are localized (i.e., positioned proximate) to one or more of the turns such that after the skew compensation bends, the length of conductors 16a, 16b are substantially the same. The use of this skew compensation technique ensures that the signal components remain substantially in-phase for most of time of travel. It is to be understood that the number of turns, arrangement and location of bends, and length of the differential conductor pair 14 shown in FIG. 1 is only an example and different routings with any number of turns or bends, or number of sets of bends may be used without departing from the scope of the embodiments. Also, the asymmetric dual bend configuration shown in FIG. 1 is only an example and as described in detail below, other configurations may be used.

As shown in FIG. 1, the first conductor 16a of the differential conductor pair 14 comprises a first set of bends 15a at a location proximate to one of the turns $T_1$ to provide skew compensation, however, these bends also introduce extra imbalance between the P and N traces. The asymmetric dual bend skew compensation scheme described herein introduces a second set of bends 15b into the second conductor 16b aligned with the first set of bends, to reduce the differential mode to common mode conversion, thereby improving EMI performance at no additional cost and without reducing the SI (Signal Integrity) performance.

Any number of sets of bends may be included to provide skew compensation while also reducing differential to common mode conversion. For example, the first conductor 16a and second conductor 16b of the differential conductor pair 14 may each comprise a plurality of sets of bends proximate to the turn to provide skew compensation while reducing differential mode to common mode conversion, with each of the sets of bends 15b in the second conductor aligned with one of the sets of bends 15a in the first conductor. The differential conductor pair 14 may comprise a plurality of unit structures, each unit structure comprising a set of bends in each conductor (first set of bends in first conductor, second set of bends in second conductor). In the example shown in FIG. 1, the first conductor 16a comprises two sets of bends 15a (one unit structure each) at a location proximate to turn $T_1$ to provide skew compensation and the second conductor 16b comprises two aligned sets of bends 15b to reduce differential mode to common mode conversion by compensating for the extra imbalance introduced by the skew compensation bends in the first conductor.

Figure 2A:
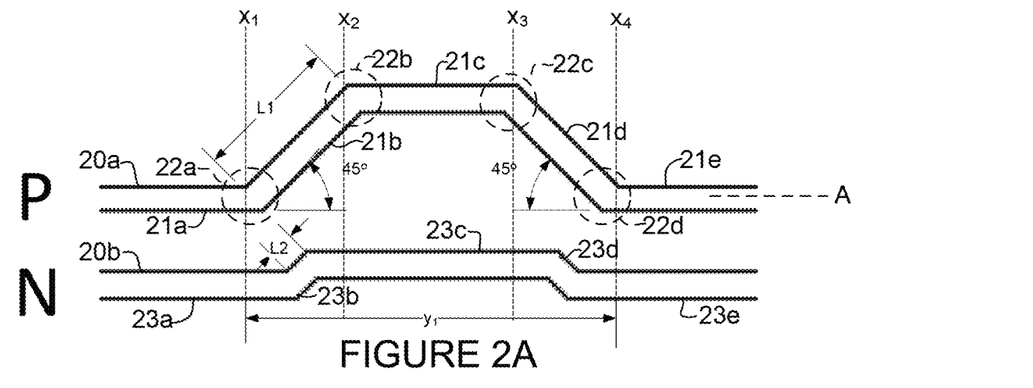
FIG. 2A illustrates an example of an asymmetric dual bend configuration of a differential conductor pair, in accordance with one embodiment.
Figure 2B:
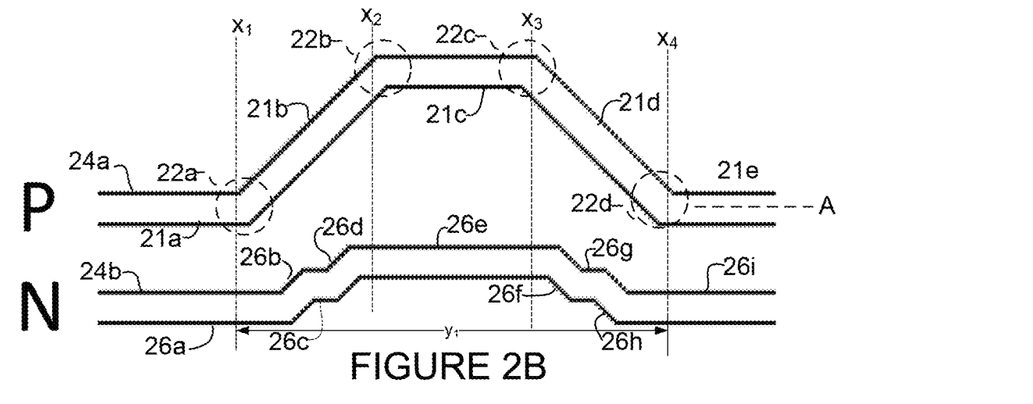
FIG. 2B illustrates another example of an asymmetric dual bend configuration.
Figure 2C:
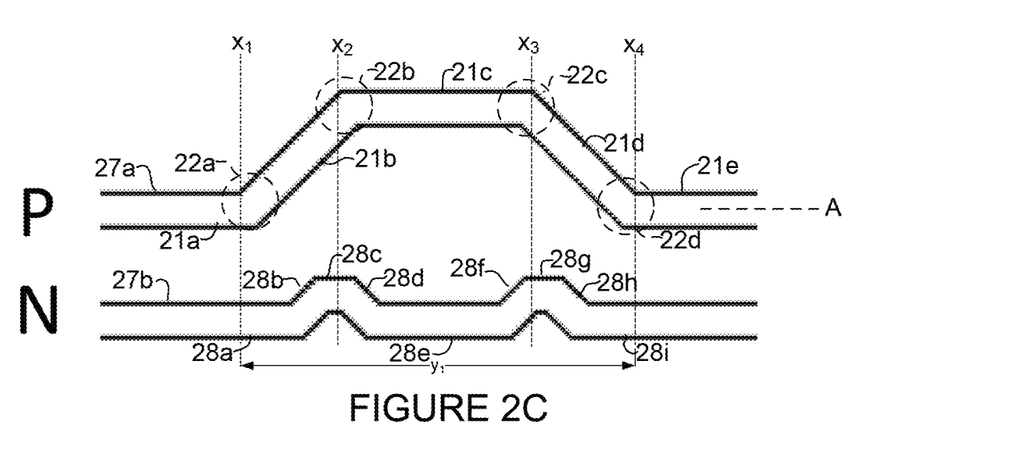
FIG. 2C illustrates yet another example of an asymmetric dual bend configuration.

Three examples of asymmetric dual bend configurations are shown in FIGS. 2A, 2B, and 2C for one unit structure (one set of bends in each conductor of the differential conductor pair). In the examples shown in FIGS. 2A-2C, the P trace includes four 45 degree corners and the N trace includes asymmetric bends within the same general transition location (e.g., between $x_1$ and $x_2$, between $x_3$ and $x_4$, within longitudinal distance $y_1$) with the same (FIG. 2A) or a different (FIGS. 2B and 2C) number of bends. It is to be understood that the shapes, angles, lengths, number, and location of bends shown in FIGS. 2A-2C is only an example and variations may be made without departing from the scope of the embodiments. For example, although a 45 degree bend is shown and described herein, the embodiments may be extended to include other degree bends or rounded bends.

Each conductor in the differential conductor pair comprises a set of bends (e.g., 15a, 15b in FIG. 1). The first set of bends in the first conductor 20a, 24a, 27a comprises a first bend 22a angled from a first straight portion 21a extending along longitudinal axis A and generally parallel to a second conductor 20b, 24b, 27b of the differential conductor pair, and a last bend 22d angled towards a second straight portion 21e extending along longitudinal axis A and generally parallel to the second conductor. As described below, the second conductor 20b, 24b, 27b comprises a second set of bends to compensate for the extra imbalance induced by the first set of bends in the first conductor 20a, 24a, 27a and reduce differential mode to common mode conversion. The second set of bends is asymmetric with the first set of bends and located longitudinally between the first bend 22a and the last bend 22d of the first conductor (e.g., between $x_1$ and $x_4$, longitudinal distance between first bend and last bend of second conductor generally equal to or less than $y_1$). Thus, the second set of bends is aligned with the first set of bends such that the second set of bends is longitudinally positioned between the first bend and the last bend of the first set of bends in the first conductor.

Each of the bends 22a, 22b, 22c, 22d in the first conductor 20a, 24a, 27a are located at a horizontal distance along the longitudinal axis A indicated by lines $x_1$, $x_2$, $x_3$, $x_4$, respectively. In each example, the first conductor 20a, 24a, 27a comprises first and third segments 21b, 21d that are angled with respect to a longitudinal axis A of the conductor (straight portions 21a and 21e). A second segment 21c is disposed between and connects the first segment 21b to the third segment 21d. The second segment 21c is substantially parallel to the longitudinal axis A of the first conductor. The four bends 22a, 22b, 22c, 22d connect the three segments 21b, 21c, 21d and straight portions 21a, 21e to define a frustoconical shape extending upward from the straight portions. It is to be understood that the term "upward" as used herein is a relative term dependent on the orientation of the traces and the PCB and does not limit the orientation or arrangement of the traces or PCB.

Figure 4:
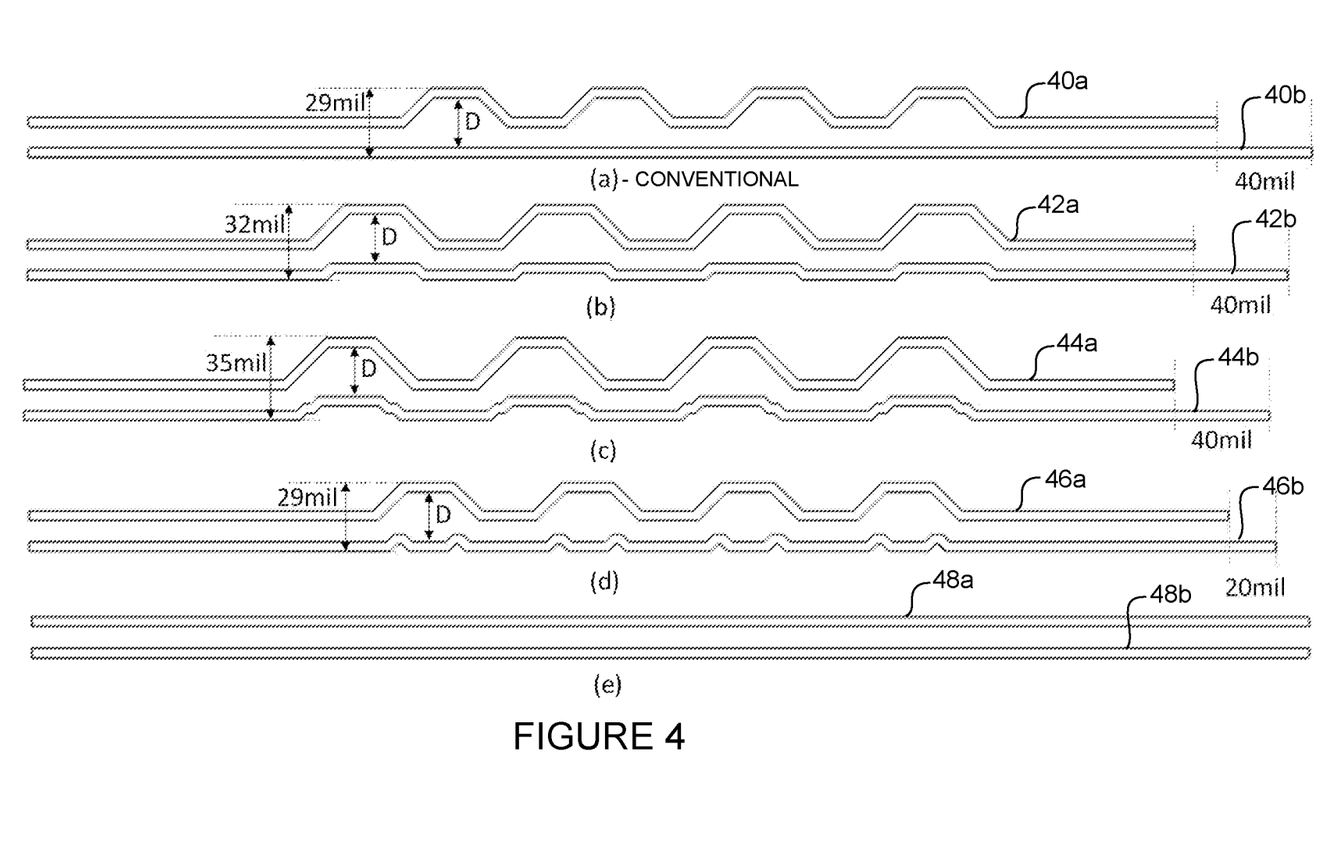
FIG. 4 illustrates fixed length routing for differential conductor pairs, with a conventional differential conductor pair shown in the example (a) for comparison with the asymmetric dual bend scheme shown in examples (b)-(d), corresponding to unit structures shown in FIGS. 2A-2C.
Figure 8:
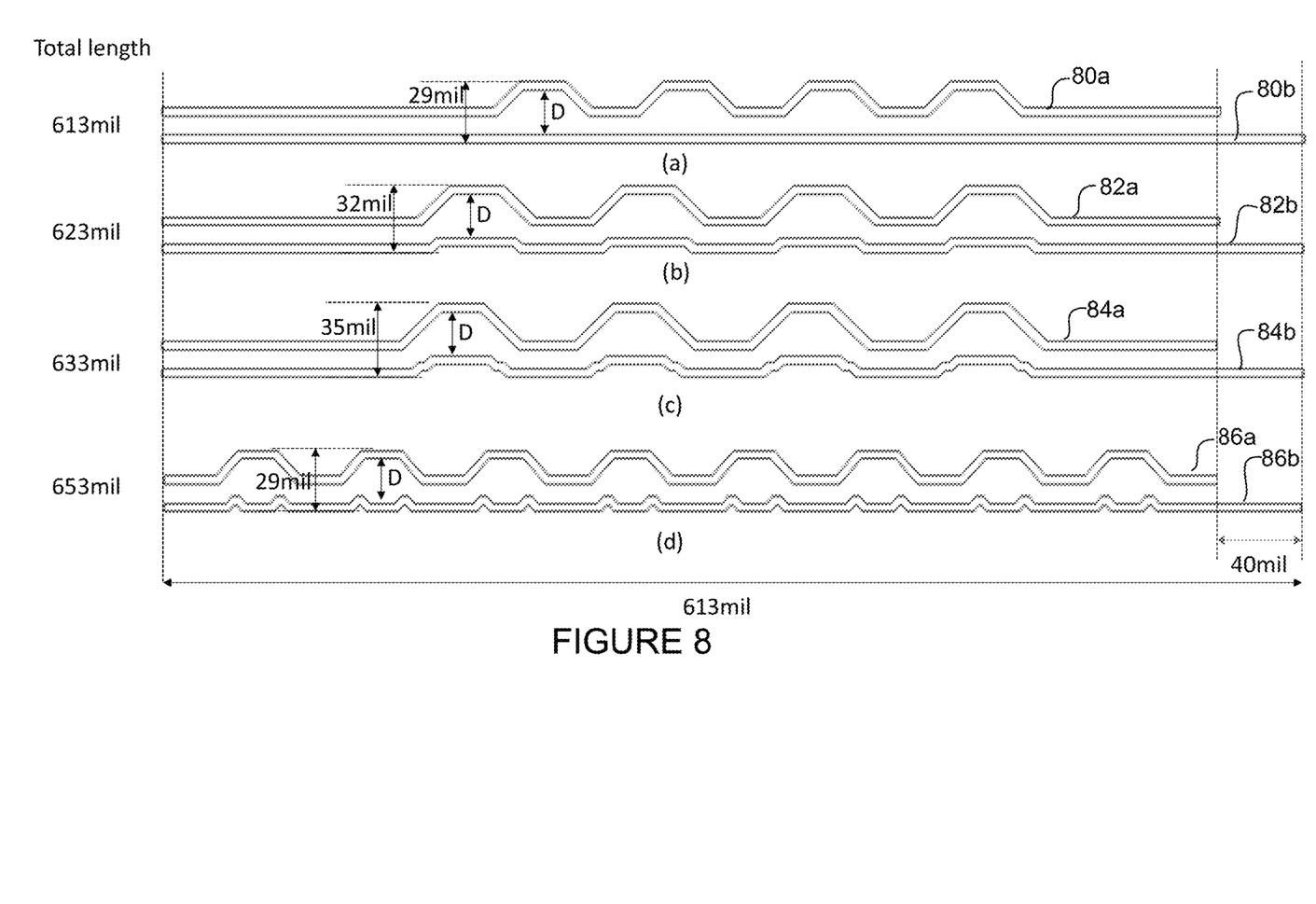
FIG. 8 illustrates fixed location routing for differential conductor pairs corresponding to the bends shown in FIGS. 4(a)-4(d).

The bends in the first conductor may be referred to as skew compensation bends (or localized skew compensation bends). The angle of the bend may vary depending on, for example, the characteristics of the differential pair, shape of the turn, differential signal characteristics, etc. In one example, the angle is approximately 45 degrees. The length of each segment, 22a, 22b, 22c, 22d and 21e may also vary, as shown in the examples of FIGS. 2A-2C. Also, it should be noted that in these examples, the first conductor is labeled as a positive trace and the second conductor is labeled as a negative trace, however, these may be switched along the path, as shown in FIG. 1. It should also be noted that while FIGS. 2A-2C show one unit structure (defined as beginning with straight portion 21a and ending with straight portion 21e and including bends 22a, 22b, 22c, and 22d in the first conductor 20a) of the differential conductor pair, the differential conductor pair may include any number of unit structures, as shown in FIGS. 1, 4, and 8.

In order to compensate for the imbalance induced by corners of the bends (first set of bends) 22a, 22b, 22c, 22d in the first conductor 20a, 24a, 27a, asymmetric bends (second set of bends) are provided in the second conductor 20b, 24b, 27b. As shown in FIGS. 2A-2C each set of bends in the second conductor is located between $x_1$ (first bend 22a angled from the first straight portion 21a extending along longitudinal axis A and generally parallel to the second conductor) and $x_4$ (last bend 22d angled towards the second straight portion 21e extending along longitudinal axis A and generally parallel to the second conductor). In the examples shown in FIGS. 2A-2C, the transitions (start and end of second set of bends) in the second conductor are located between (e.g., generally aligned with) transitions (start and end of first set of bends) in the first conductor. Each set of bends in the second conductor is this aligned with one of the sets of bends in the first conductor. The different asymmetric dual bend configurations of the second conductor shown in FIGS. 2A-2C are described below.

Referring first to FIG. 2A, the second conductor 20b comprises straight sections 23a, 23c, and 23e connected by angled sections 23b and 23d, which define a frustoconical shape. This configuration includes four bends in both the first and second conductors 20a, 20b. The shapes defined by the bends in the first and second conductors are asymmetric and the bends are thus referred to herein as asymmetric bends.

As previously described, extra imbalance caused by a corner may induce an odd mode and an even mode and these two modes will propagate in the straight trace after the corner (e.g., L1 and L2 in FIG. 2A). Each line L1, L2 has a corresponding delta time T1, T2 and since there is a different propagation speed of these two modes, T1>T2 due to L1>L2. More delta time induces higher imbalance, so in order to compensate this imbalance as much as possible, additional variants of asymmetric dual bend configurations are provided are shown in FIGS. 2B and 2C. In these asymmetric dual bend configurations, additional corners are introduced in the N trace (second conductor $24b$, $27b$) to compensate the imbalance caused by the difference in L1 and L2.

The second conductor $24b$ of FIG. 2B comprises straight sections $26a$, $26c$, $26e$, $26g$, and $26i$ connected by angled portions $26b$, $26d$, $26f$, and $26h$. The unit structure of the second conductor $24b$ in this example comprises eight bends. The bends of the second conductor $24b$ define a first stepped section extending upward and a second stepped section extending downward such that the straight section $26e$ interposed between the stepped sections is parallel to and above the straight sections $26a$, $26i$ located before and after the bends. The second conductor $24b$ in this example comprises twice as many bends as the first conductor $24a$, with the bends in the second conductor located between the first bend $22a$ and the last bend $22d$ in the first conductor (between $x_1$ and $x_4$).

Referring now to FIG. 2C, the second conductor $27b$ comprises a matched pair of bends defining two frustoconical shapes. Eight bends define angled sections $28b$, $28d$, $28f$, and $28h$ that connect straight sections $28a$, $28c$, $28e$, $28g$, and $28i$. The bends in the second conductor $27b$ are located between the first and last bends $22a$, $22d$ of the first conductor $27a$ (between $x_1$ and $x_4$).

It is to be understood that the asymmetric dual bend configurations shown in FIGS. 2A-2C are only examples and a different number of bends, different angle, or a different number or length of straight and angled sections may be used without departing from the scope of the embodiments.

The following describes a process by which the extra imbalance is introduced by the bends in the first conductor and how bends in the second conductor compensate for the imbalance and thereby reduce differential mode to common mode conversion.

Figure 3A:
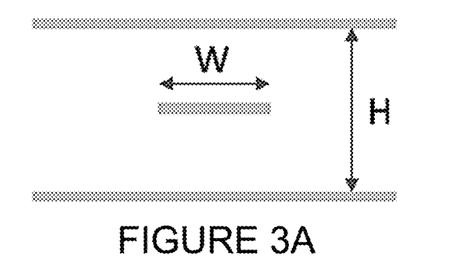
FIG. 3A is a sectional view illustrating a stack up of a stripline trace.
Figure 3B:
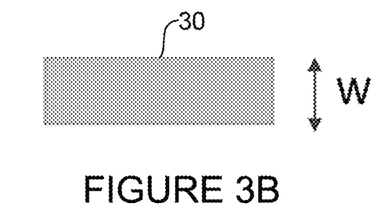
FIG. 3B is a top view of a straight stripline trace.
Figure 3C:
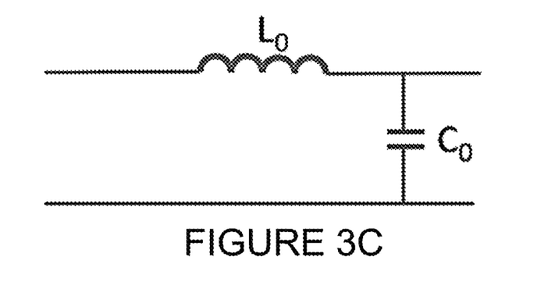
FIG. 3C is an equivalent circuit of the straight stripline trace of FIG. 3B.
Figure 3D:
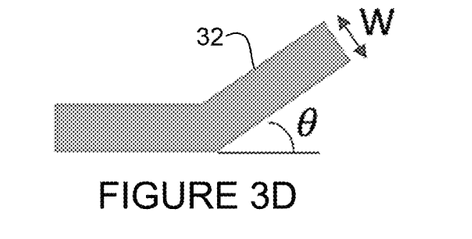
FIG. 3D is a top view of an angled stripline trace.
Figure 3E:
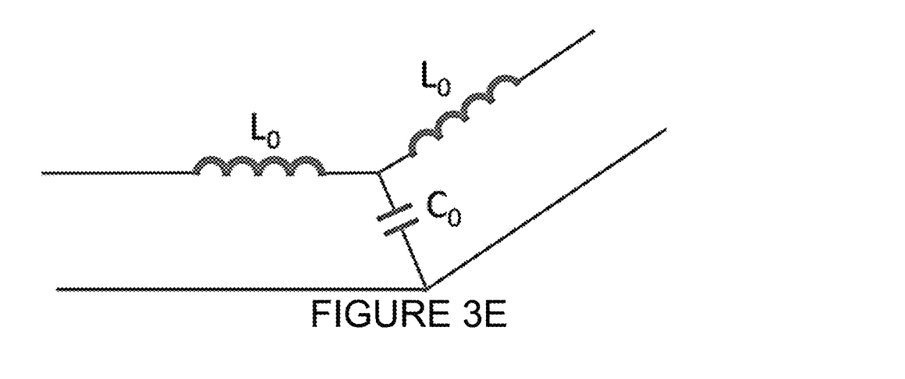
FIG. 3E is an equivalent circuit of the angled stripline trace of FIG. 3D.

Referring now to FIGS. 3A-3E, examples are shown to illustrate how the corner (bend) introduces extra imbalance in the differential pair. FIG. 3A shows a stack up of a stripline trace in sectional view and illustrates a stripline trace width W and height H, as used in below equations. FIG. 3B is a top view of one section 30 of a straight trace with width W and FIG. 3C illustrates a corresponding equivalent circuit (inductance $L_0$ and capacitance $C_0$) for the straight trace 30 in FIG. 3B. FIG. 3D is a top view of an angled stripline trace 32 and shows an angle θ at a bend of the stripline trace and width W, and FIG. 3E illustrates a corresponding equivalent circuit for the trace shown in FIG. 3D.

The inductance ($L_o$) and capacitance ($C_o$) of the equivalent circuit shown in FIG. 3C for the straight stripline trace may be calculated as follows:

$$Z_0 = \frac{60}{\sqrt{\varepsilon_r}} \ln\left(\frac{1.9H}{0.8W}\right) \quad (1)$$

$$C_0 = \frac{5.55 \times 10^{-11} \varepsilon_r}{\ln(1.9H/0.8W)} \quad (2)$$

$$L_0 = C_0 Z_0^2 \quad (3)$$

The inductance ($L_o$) and capacitance ($C_o$) of the equivalent circuit shown in FIG. 3E for the angled stripline trace may be calculated as follows:

$$\frac{C_0}{Z_0} = -\frac{\lambda}{2\pi D}\cot\frac{\theta}{2} \quad (4)$$

$$\frac{L_0}{Z_0} = \frac{2D}{\lambda}\left\{\psi\left[-\frac{1}{2}\left(1 - \frac{\theta}{\pi}\right)\right] - \psi\left[-\frac{1}{2}\right]\right\} \quad (5)$$

where, $$D = W + \frac{2H}{\pi}\ln 2 \quad (6)$$

wherein;
$L_0$ is inductance,
$C_0$ is capacitance,
$Z_0$ is impedance,
D is distance between two traces in the bend section,
W is width as shown in FIGS. 3A and 3B,
H is height as shown in FIG. 3A,
θ is angle of the bend section,
ψ(x) is the logarithmic derivative of x (i.e., d(log x)/dx),
λ is wavelength, and
$\varepsilon_r$ is dielectric constant.
The electrical and other parameters represented in the impedance, conductance, and inductance equations are well known by those skilled in the art.

According to FIGS. 3A-3E and equations (2)-(5), different equivalent circuit topology and inductance and capacitance parameter values may be observed between a 45 degree corner and a straight trace. Considering one 45 degree corner in the P trace and one straight section in corresponding N trace, extra imbalance is induced.

In order to compensate for the extra imbalance induced by the corner, the asymmetric dual bend is introduced to replace conventional skew compensation bends located in only one trace (e.g., as shown in example (a) in FIG. 4). In contrast to the conventional differential conductor pair shown in example (a), the asymmetric dual bend scheme shown in examples (b), (c), and (d) in FIG. 4 (corresponding to unit structures shown in FIGS. 2A-2C, respectively) includes bends in both traces (P and N). For one unit structure, each trace includes bends and less extra imbalance is caused by one trace having corners and the other being straight. The bends in the second conductor are aligned with the bends in the first conductor and provided to compensate for the imbalance caused by the skew compensation bends in the first conductor.

For the skew compensation function, since the bend size is different, the distance D between the two traces in the bend section may be designed the same as shown in example (a) of FIG. 4, thereby ensuring that each configuration has the same skew compensation function. Also, since D is the same, impedance in the bend sections also remains the same. This ensures that the asymmetric dual bend configuration can provide almost the same SI performance (Sdd21) as the single bend compensation scheme shown in (a) of FIG. 4, while substantially improving the mode conversion performance (Scd21), as described below with respect to FIGS. 6A, 6B, 7A, and 7B and 9A, 9B, 10A, and 10B. In one or more embodiments, in order to ensure manufacturability, the length of the bend can be modified, as long as the distance D between the two traces remains the same as the single bend scheme shown in example (a) of FIG. 4. In example (a), the total width of the bend is 29 mil, in the example (b), the total width of the bend is 32 mil, in example (c), the total width of the bend is 35 mil, and in example (d), the total width of the bend is 29 mil.

Simulations were performed to compare mode conversion (Scd21) (conversion between differential mode and common mode) and insertion loss (Sdd21) (input differential insertion loss) between single bend and asymmetric dual bend configurations in stripline (FIGS. 6A, 6B, 9A, 9B) and microstrip (FIGS. 7A, 7B, 10A, 10B) routing. FIGS. 6A, 6B, 7A, and 7B illustrate fixed length scenarios shown in FIG. 4 and FIGS. 9A, 9B, 10A, and 10B illustrate fixed location scenarios shown in FIG. 8. In the fixed length scenario, the different stop locations are indicated (e.g., 40 mil (FIGS. 4 and 8) or 20 mil (FIG. 4) offset). The fixed length scenario is evaluated to compare the benefits achieved by the asymmetric skew compensation techniques described herein without adding any ambiguity due to difference in insertion loss due to different total lengths. The fixed position scenario is evaluated to understand benefits of the asymmetric skew compensation technique in a real PCB where the positions of components/pins are initially fixed based on the integrated circuit packaging, relative position with other components, and other restrictions such as thermal restrictions and the like. As the locations of the components are fixed, traces need to be routed keeping the relative distance between the ends of P and N traces fixed.

Referring first to FIG. 4, the traces are routed such that all are of equal length (e.g., 613 mil). FIG. 4 shows five examples: (a) conventional single bend configuration with skew compensation bends in first conductor 40a and a straight second conductor 40b; (b) asymmetric dual bend configuration of FIG. 2A for conductors 42a, 42b; (c) asymmetric dual bend configuration of FIG. 2B for conductors 44a, 44b; (d) asymmetric dual bend configuration of FIG. 2C for conductors 46a, 46b; and (e) reference trace with two straight conductors 48a, 48b. The skew compensation length provided by the configurations shown in examples (b)-(d) in FIG. 4 are illustrated in FIGS. 5A, 5B, and 5C (corresponding to FIGS. 2A, 2B, and 2C, respectively).

The skew compensation length for the bend (i.e., Δ length between the P and N trace) for example (a) in FIG. 4 with a 45 degree bend in the P trace having a horizontal length of 12 mil and a vertical length of 12 mil is calculated as follows:

$$12 \times (\sqrt{2}-1) \times 2 = 9.95 \text{ mil}$$

Figure 5A:
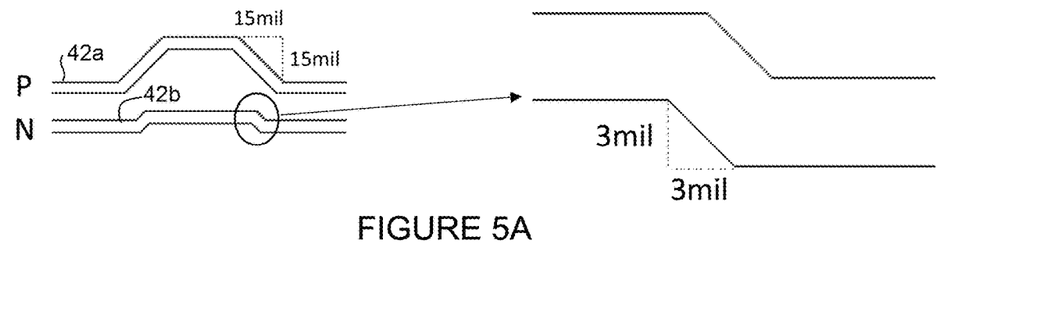
FIG. 5A illustrates an example of skew compensation length provided by the asymmetric dual bend configuration shown in FIG. 2A.
Figure 5B:
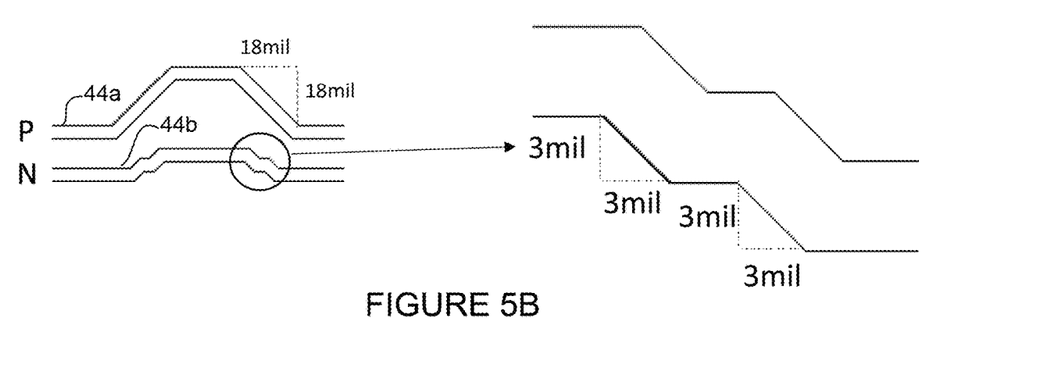
FIG. 5B illustrates an example of skew compensation length provided by the asymmetric dual bend configuration shown in FIG. 2B.
Figure 5C:
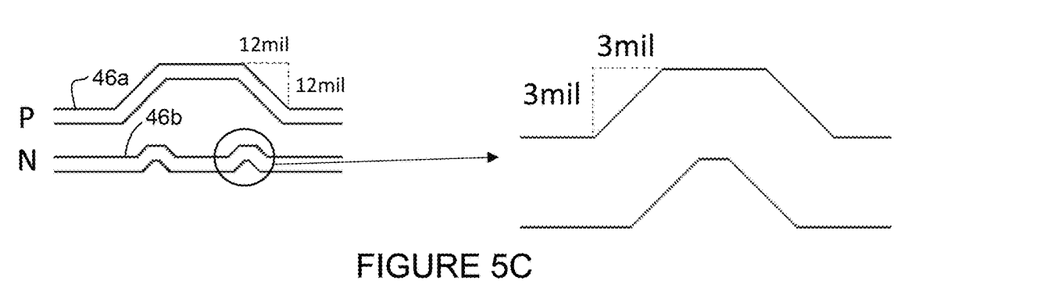
FIG. 5C illustrates an example of skew compensation length provided by the asymmetric dual bend configuration shown in FIG. 2C.

The Δ length between the P and N trace for the example shown in FIG. 5A is calculated as follows (for dimensions of 15 mil and 3 mil as shown in FIG. 5A):

$$15 \times (\sqrt{2}-1) \times 2 - 3 \times (\sqrt{2}-1) \times 2 = 9.95 \text{ mil}$$

The Δ length between the P and N trace for example shown in FIG. 5B is calculated as follows (for dimensions of 18 mil and 3 mil as shown in FIG. 5B):

$$18 \times (\sqrt{2}-1) \times 2 - 6 \times (\sqrt{2}-1) \times 2 = 9.95 \text{ mil}$$

The Δ length between the P and N trace for the example shown in FIG. 5C is calculated as follows (for dimensions of 12 mil and 3 mil as shown in FIG. 5C):

$$12 \times (\sqrt{2}-1) \times 2 - 3 \times (\sqrt{2}-1) \times 4 = 4.97 \text{ mil (9.95 mil for the pair of bends)}$$

Figure 6A:
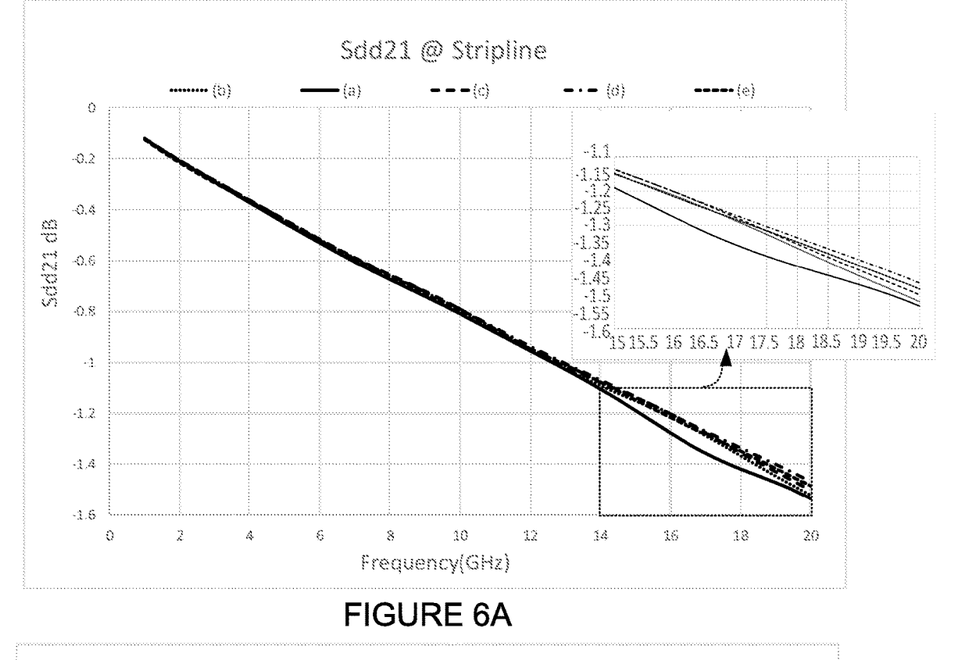
FIG. 6A is a graph showing insertion loss for the differential conductor pairs shown in FIG. 4 for stripline.
Figure 6B:
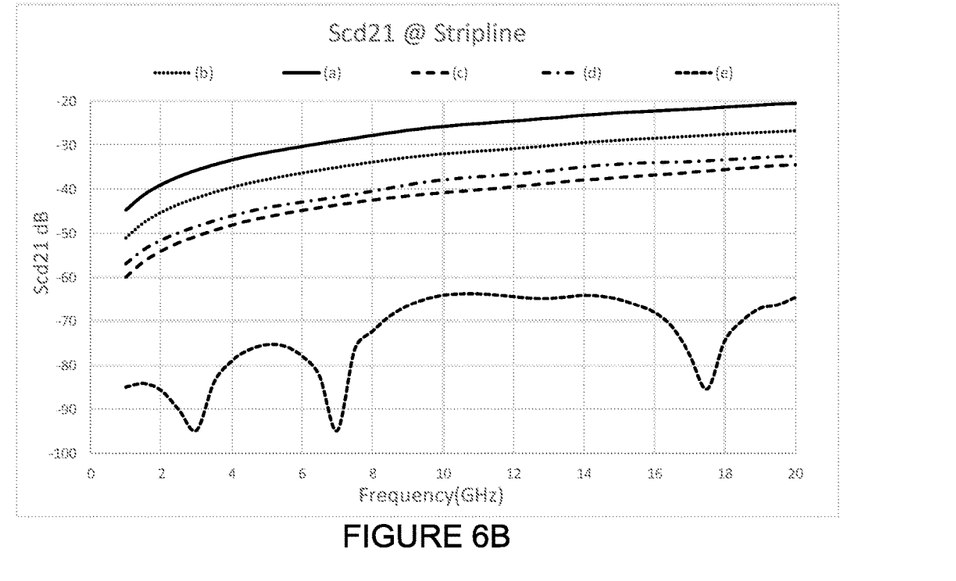
FIG. 6B is a graph showing differential mode to common mode conversion for the differential conductor pairs shown in FIG. 4 for stripline.

FIGS. 6A and 6B show the Sdd21 and Scd21 performance, respectively, of stripline for the examples (b), (c), (d), and (e) shown in FIG. 4. Each graph shows dB (decibel) vs Frequency (GHz). The asymmetric dual bend of configuration (c) has the best EMI (least Scd21) performance among all bend differential pairs and the single bend (shown in (a) of FIG. 4) has the worst EMI (max Scd21) performance.

Figure 7A:
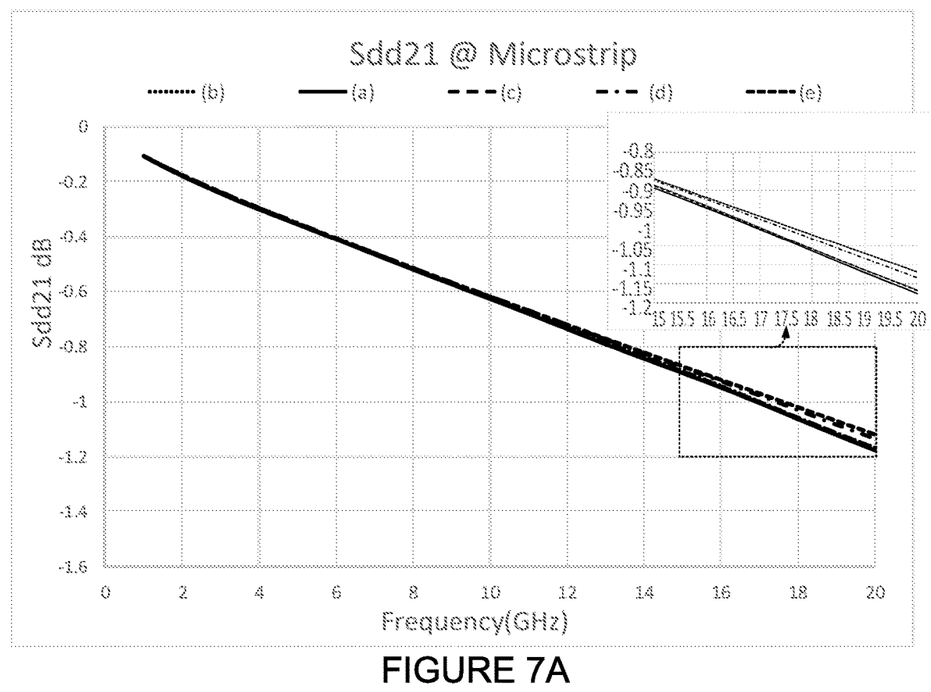
FIG. 7A is a graph showing insertion loss for the differential conductor pairs shown in FIG. 4 for microstrip.
Figure 7B:
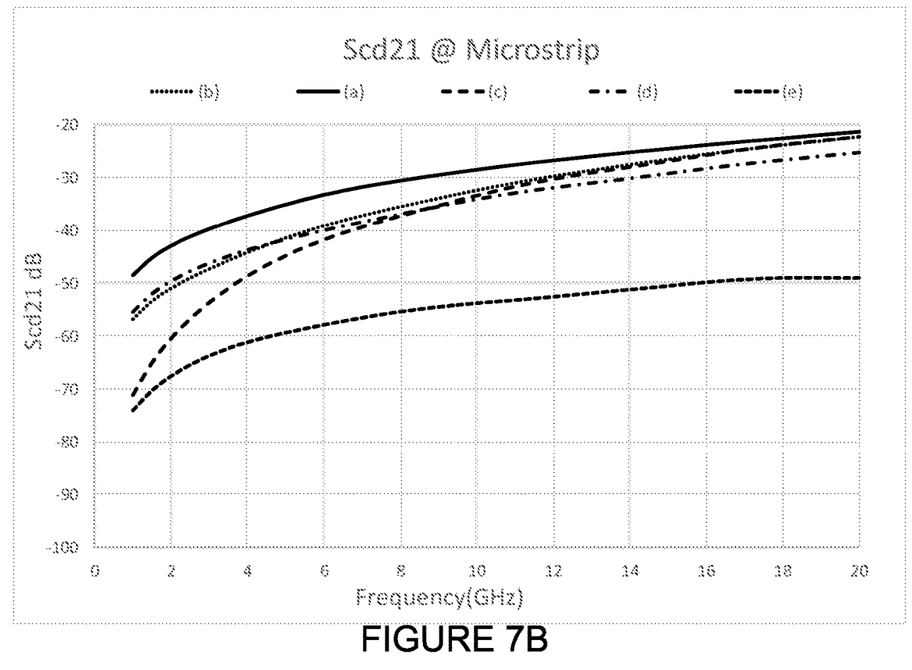
FIG. 7B is a graph showing differential mode to common mode conversion for the differential conductor pairs shown in FIG. 4 for microstrip.

FIGS. 7A and 7B show the Sdd21 and Scd21 performance, respectively, of microstrip for the examples (b), (c), (d), and (e) shown in FIG. 4. Each graph shows dB (decibel) vs Frequency (GHz). The simulation results show that configurations have similar SI performance and the asymmetric dual bend configurations ((b)-(d)) have better EMI performance than the single bend configuration (a).

FIG. 8 shows fixed start and stop locations for differential routing (80a and 80b in example (a); 82a and 82b in example (b); 84a and 84b in example (c); and 86a and 86b in example (d). In this example, the differential traces have a different total length (e.g., 40 mil). The traces are routed assuming the location of the P/N end point is fixed. Each example (a), (b), (c), and (d) shown in FIG. 8 has the same start and end points and different total length. As shown in FIG. 8, a total width of the bends may be increased from 29 mil (examples (a) and (d)) to 32 mil (example (b)) or even 35 mil (example (c)), which may need a bit more space. The total length shown in the examples of FIG. 8 include 613 mil (example (a)), 623 mil (example (b)), 633 mil (example (c)), and 653 mil (example (d)). Although reference example (e) (from FIG. 4) is not shown in FIG. 8, it would be the same type of reference line and is included in the simulations of FIGS. 9A, 9B, 10A, and 10B.

Figure 9A:
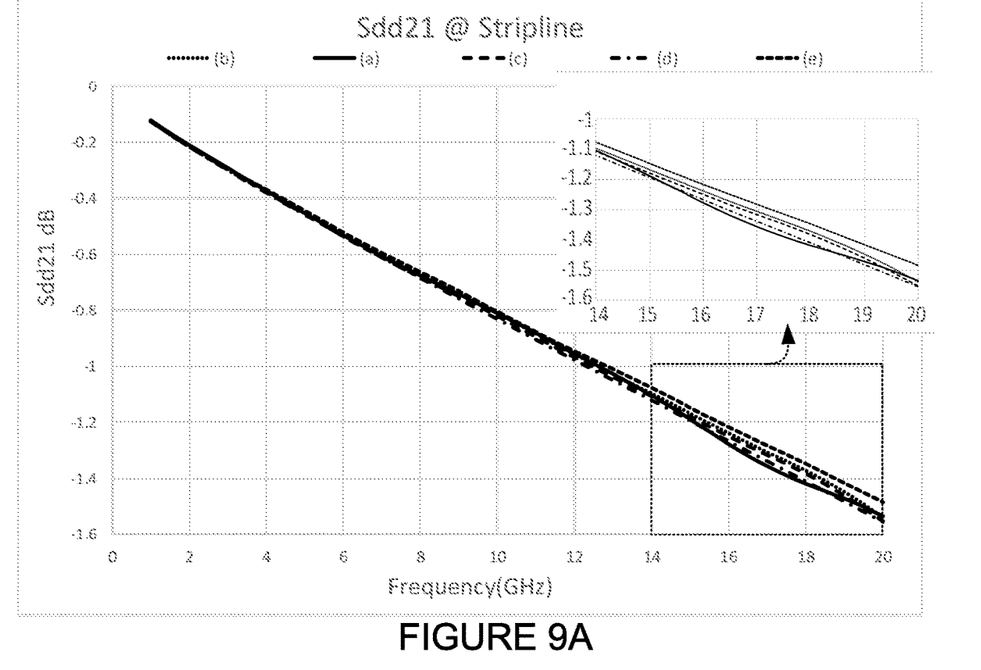
FIG. 9A is a graph showing insertion loss for the differential conductor pairs shown in FIG. 8 for stripline.
Figure 9B:
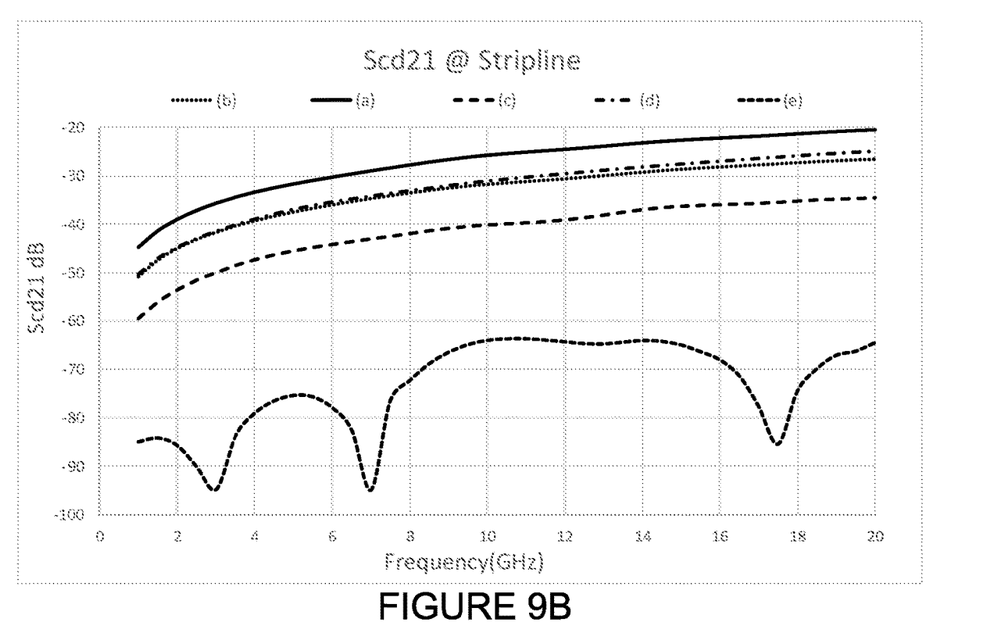
FIG. 9B is a graph showing differential mode to common mode conversion for the differential conductor pairs shown in FIG. 8 for stripline.
Figure 10A:
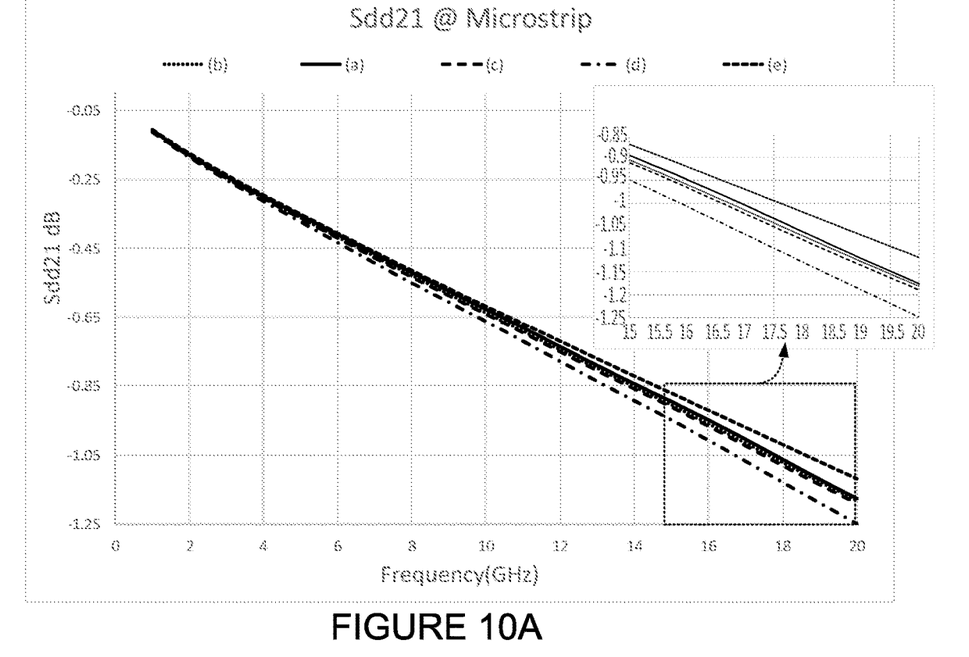
FIG. 10A is a graph showing insertion loss for the differential conductor pairs shown in FIG. 8 for microstrip.
Figure 10B:
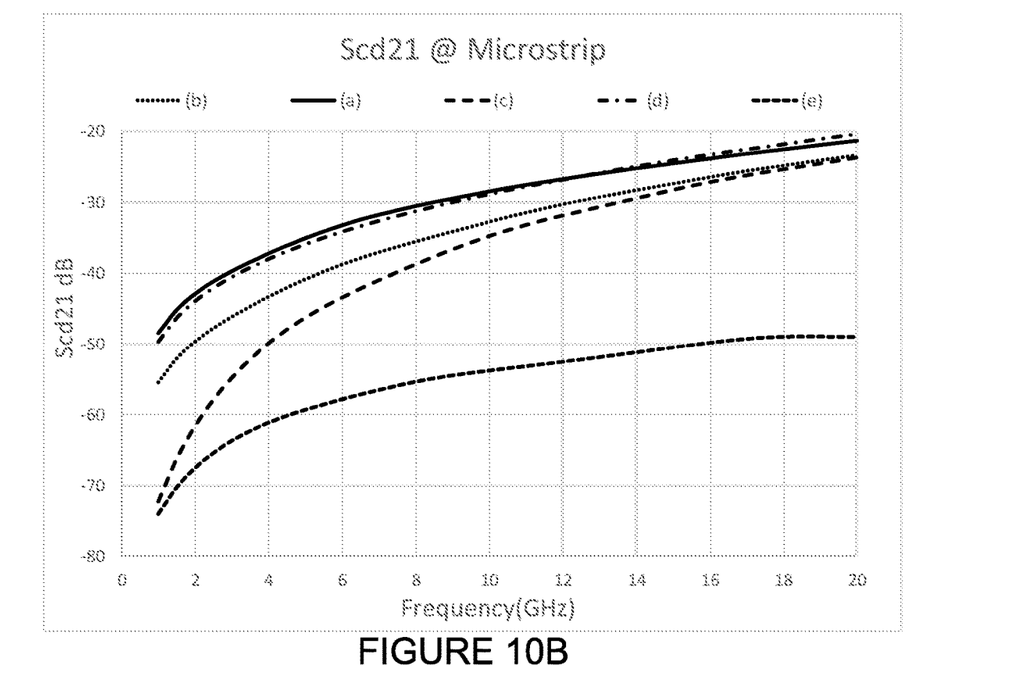
FIG. 10B is a graph showing differential mode to common mode conversion for the differential conductor pairs shown in FIG. 8 for microstrip.

The SI (Sdd21) and EMI (Scd21) performance in stripline are shown in FIGS. 9A and 9B, respectively, and in microstrip in FIGS. 10A and 10B, respectively. Each graph shows dB (decibel) vs Frequency (GHz). In the stripline application, the asymmetric dual bend shown in example (c) in FIG. 8 has the best EMI performance and all configurations have similar SI performance. In the microstrip routing, the asymmetric dual bend shown in example (c) in FIG. 8 has the best EMI performance and the asymmetric dual bend shown in example (d) in FIG. 8 has the worst SI performance due to the longest length.

In these simulations Sdd21 variation was less than 0.1 dB between configurations (a)-(d) in FIGS. 4 and 8. Scd21 variation, which determines the EMC performance of the differential conductor pairs, was high. The asymmetric dual bend configuration shown in FIG. 2B appeared to provide minimum Scd21 in the scenarios evaluated.

Figure 11:
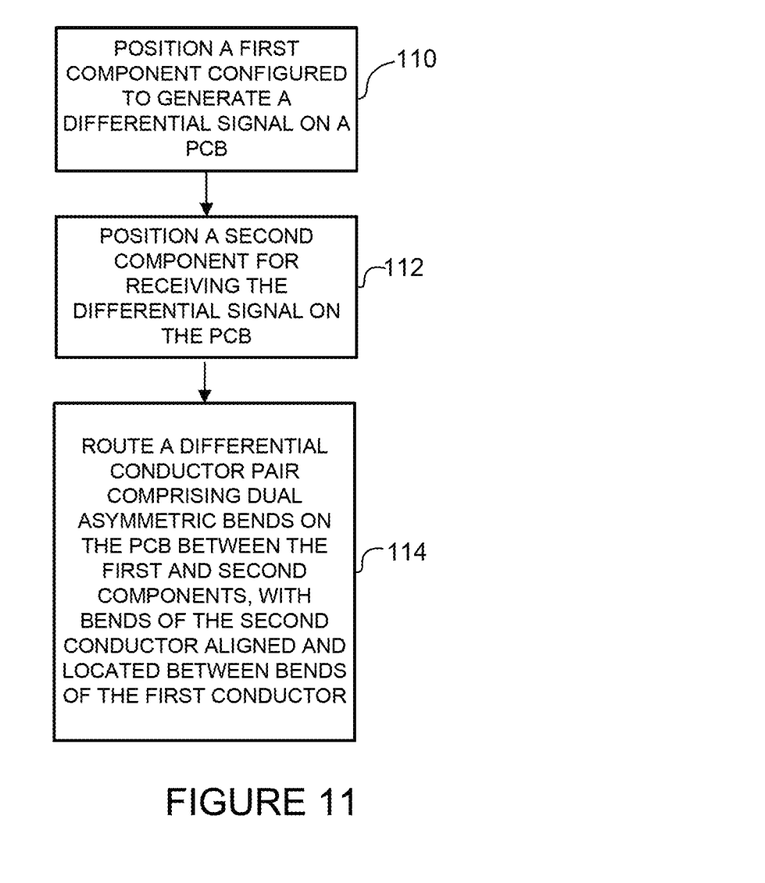
FIG. 11 is an overview of a process for routing a differential conductor pair with dual asymmetric bends, in accordance with one embodiment.

FIG. 11 is a flowchart illustrating an overview of a process for routing a differential pair of conductors with asymmetric dual bends, in accordance with one embodiment. At step 110, a first component configured to generate a differential signal is positioned on a PCB. A second component configured to receive the differential signal from the first component is also positioned on the PCB (step 112). In one or more embodiments, a differential conductor pair comprising asymmetric dual bends is routed between the first and second components along a path comprising at least one turn, with bends of the second conductor aligned with and located longitudinally between skew compensation bends of the first conductor to reduce differential mode to common mode conversion (step 114). In one or more embodiments, a first conductor and a second conductor of the differential conductor pair each comprise a plurality of sets of bends proximate to the turn to provide skew compensation while reducing differential mode to common mode conversion and with each of the sets of bends in the second conductor aligned with one of the sets of bends in the first conductor.

As can be observed from the foregoing, the embodiments described herein provide numerous advantages as compared to conventional skew compensation techniques. For example, the asymmetric dual bend skew compensation introduces bends in both P and N traces of a differential pair to compensate the skew and mitigate extra imbalance, which can help to reduce mode conversion and improve EMI performance. The asymmetric dual bend introduces no additional costs and may provide a slight benefit in SI performance. Simulation results on various routing scenarios have shown 5-10 dB improvement in Scd21.

It is to be understood that the asymmetric dual bend configurations (size, shape, angle, length, number of bends, etc.) described herein are only examples and other configurations may be used in any arrangement without departing from the scope of the embodiments.

Although the method and apparatus have been described in accordance with the embodiments shown, one of ordinary skill in the art will readily recognize that there could be variations made to the embodiments without departing from the scope of the invention. Accordingly, it is intended that all matter contained in the above description and shown in the accompanying drawings shall be interpreted as illustrative and not in a limiting sense.

What is claimed is:

1. An apparatus comprising:
a printed circuit board; and
a differential conductor pair extending along a path between a first component configured to generate a differential signal and a second component configured to receive the differential signal, wherein the path comprises at least one turn in which the differential conductor pair changes direction;
wherein a first conductor of the differential conductor pair comprises a first set of bends at a location proximate to the turn to provide skew compensation, said first set of bends comprising a first bend angled from a first straight portion extending along a longitudinal axis generally parallel to a second conductor of the differential conductor pair and a last bend angled towards a second straight portion extending along the same longitudinal axis generally parallel to said second conductor, said second conductor comprising a second set of bends to reduce differential mode to common mode conversion, said second set of bends asymmetric with said first set of bends and aligned therewith such that said second set of bends is longitudinally positioned between said first bend and said last bend of said first set of bends.

2. The apparatus of claim 1 wherein said first set of bends comprises four bends.

3. The apparatus of claim 1 wherein said second set of bends comprises four bends.

4. The apparatus of claim 1 wherein said first set of bends defines a frustoconical shape and said second set of bends defines at least one frustoconical shape.

5. The apparatus of claim 1 wherein said first conductor comprises a plurality of first sets of bends including said first set of bends, and said second conductor comprises a plurality of second sets of bends including said second set of bends, each respective one of said second sets of bends aligned with a respective one of said first sets of bends.

6. The apparatus of claim 1 wherein said second set of bends defines a first portion extending upward from a first straight section of said second conductor and a second portion extending downward towards a second straight section such that a third straight section interposed between said first and second portions is located parallel to and above said first and second straight sections disposed on opposite sides of said second set of bends.

7. An apparatus comprising:
a printed circuit board; and
a differential conductor pair extending along a path between a first component configured to generate a differential signal and a second component configured to receive the differential signal, wherein the path comprises at least one turn in which the differential conductor pair changes direction;
wherein a first conductor of the differential conductor pair comprises a first set of bends at a location proximate to the turn to provide skew compensation, said first set of bends comprising a first bend angled from a first straight portion extending along a longitudinal axis generally parallel to a second conductor of the differential conductor pair and a last bend angled towards a second straight portion extending along the longitudinal axis generally parallel to said second conductor, said second conductor comprising a second set of bends to reduce differential mode to common mode conversion, said second set of bends asymmetric with said first set of bends and aligned therewith such that said second set of bends is longitudinally positioned between said first bend and said last bend of said first set of bends, wherein said second set of bends comprises eight bends.

8. An apparatus comprising:
a printed circuit board; and
a differential conductor pair extending along a path between a first component configured to generate a differential signal and a second component configured to receive the differential signal, wherein the path comprises at least one turn in which the differential conductor pair changes direction;
wherein a first conductor of the differential conductor pair comprises a first set of bends at a location proximate to the turn to provide skew compensation, said first set of bends comprising a first bend angled from a first straight portion extending along a longitudinal axis generally parallel to a second conductor of the differential conductor pair and a last bend angled towards a second straight portion extending along the longitudinal axis generally parallel to said second conductor, said second conductor comprising a second set of bends to reduce differential mode to common mode conversion, said second set of bends asymmetric with said first set of bends and aligned therewith such that said second set of bends is longitudinally positioned between said first bend and said last bend of said first set of bends, wherein said second set of bends comprises a matching pair of bends.

9. The apparatus of claim 8 wherein a straight section is interposed between said matching pair of bends and extends along a longitudinal axis of straight sections of said second conductor located before and after said second set of bends.

10. A method comprising:

positioning a first component for generating a differential signal on a printed circuit board;

positioning a second component for receiving the differential signal on the printed circuit board; and routing a differential conductor pair on a path between said first component and said second component, wherein the path comprises at least one turn in which the differential conductor pair changes direction;

wherein a first conductor and a second conductor of the differential conductor pair each comprises a plurality of sets of bends proximate to the turn to provide skew compensation while reducing differential mode to common mode conversion, wherein each of said plurality of sets of bends in the second conductor is aligned with a respective one of the sets of bends in the first conductor, and wherein each of the sets of bends in the second conductor comprises double the number of bends in each of the sets of bends in the first conductor, each of the sets of bends in the first conductor comprising at least two bends.

11. The method of claim 10 wherein each of the sets of bends in the first conductor comprises four bends and each of the sets of bends in the second conductor comprises eight bends.

12. The method of claim 10 wherein each of the sets of bends in the second conductor defines a first portion extending upward from a first straight section of said second conductor and a second portion extending downward from a second straight section such that a third straight section interposed between said first and second portions is located parallel to and above said first and second straight sections disposed on opposite sides of the set of bends in said second conductor.

13. The method of claim 10 wherein each of said plurality of sets of bends defines a frustoconical shape extending in an upward direction.

14. The method of claim 10 wherein each of said plurality of sets of bends in the second conductor has the same configuration.

15. A method comprising:

positioning a first component for generating a differential signal on a printed circuit board;

positioning a second component for receiving the differential signal on the printed circuit board; and routing a differential conductor pair on a path between said first component and said second component, wherein the path comprises at least one turn in which the differential conductor pair changes direction;

wherein a first conductor and a second conductor of the differential conductor pair each comprises a plurality of sets of bends proximate to the turn to provide skew compensation while reducing differential mode to common mode conversion, wherein each of said plurality of sets of bends in the second conductor is aligned with a respective one of the sets of bends in the first conductor, and wherein said plurality of sets of bends in the second conductor comprises a matching pair of bends.

16. An apparatus comprising:

a printed circuit board; and a differential conductor pair extending along a path between a first component configured to generate a differential signal and a second component configured to receive the differential signal, wherein the path comprises at least one turn in which the differential conductor pair changes directions;

wherein a first conductor of the differential conductor pair comprises a first set of bends at a location proximate to the turn to provide skew compensation and a second conductor comprises a second set of bends to reduce differential mode to common mode conversion, said second set of bends asymmetric with said first set of bends and aligned therewith, wherein a number of bends in said second set of bends is greater than a number of bends in said first set of bends, and wherein said first set of bends and said second set of bends define frustoconical shapes extending in the same direction and wherein said second set of bends is longitudinally positioned between a first bend and a last bend in said first set of bends.

17. The apparatus of claim 16 wherein said second set of bends comprises twice as many bends as said first set of bends.

18. The apparatus of claim 16 wherein said second set of bends defines a first portion extending upward from a first straight section of said second conductor and a second portion extending downward such that a third straight section interposed between said first and second portions is located parallel to and above said first and second straight sections disposed on opposite sides of said second set of bends.

* * * * *